United States Patent [19]
Straemke

[11] Patent Number: 5,216,223
[45] Date of Patent: Jun. 1, 1993

[54] PLASMA TREATMENT APPARATUS

[76] Inventor: Siegfried Straemke, Fichtenhain 6, D-5135 Selfkant 4, Fed. Rep. of Germany

[21] Appl. No.: 660,667

[22] Filed: Feb. 25, 1991

[30] Foreign Application Priority Data

Feb. 26, 1990 [DE] Fed. Rep. of Germany ..... 40059561

[51] Int. Cl.$^5$ .............................................. B23K 9/00
[52] U.S. Cl. .................. 219/121.43; 219/121.44; 204/298.35; 204/298.41; 118/719
[58] Field of Search ........... 219/121.4, 121.43, 121.44; 204/298.35, 298.38, 298.17, 298.41; 118/723, 730, 719; 156/345, 646, 643

[56] References Cited

U.S. PATENT DOCUMENTS

| | | | |
|---|---|---|---|
| 4,681,773 | 7/1987 | Bean | 118/730 |
| 4,857,160 | 8/1989 | Landau et al. | 156/345 |
| 4,886,571 | 12/1989 | Suzuki et al. | 156/345 |
| 4,886,592 | 12/1989 | Anderle et al. | 118/730 |
| 4,889,609 | 12/1989 | Cannella | 156/345 |
| 4,891,488 | 1/1990 | Davis et al. | 118/709 |
| 4,969,416 | 11/1990 | Schumaker et al. | 156/345 |
| 4,984,531 | 1/1991 | Zejdu et al. | 118/730 |
| 4,987,856 | 1/1991 | Hey et al. | 118/730 |

Primary Examiner—Mark H. Paschall
Attorney, Agent, or Firm—Spensley Horn Jubas and Lubitz

[57] ABSTRACT

A plasma treatment apparatus is provided with a vacuum chamber having a rotary plate arranged therein. Within the vacuum chamber, the workpieces are subjected, at a low pressure of an inserted treatment gas, to a glow discharge for surface treatment with high temperatures. The workpieces are transferred through a sluice to the rotary table arranged in the vacuum chamber and are treated at selectable treatment positions. By providing a plurality of rotary tables, the workpieces can be stored in a three-dimensional arrangement. Partition walls are provided for dividing the rotary table into compartments for allowing different types of treatments at different treatment positions. During insertion or removal of workpieces into or from the vacuum chamber, treatment of the other workpieces can be continued. The treatment apparatus is adapted for continuous operation and, additionally, allows different lengths of treatment, temperatures of treatment and plasma activities for the individual workpieces.

27 Claims, 2 Drawing Sheets

PLASMA TREATMENT APPARATUS

BACKGROUND OF THE INVENTION

1. Field of the Invention

The invention is directed to a plasma treatment apparatus.

2. Description of Related Art

In plasma treatment of workpieces, a glow discharge in a vacuum is generated between the workpiece and a counterelectrode, while certain gases for plasma generation are present at a very small pressure. In this process, gas atoms interact at high temperatures with the surface of the workpiece for changing the properties of the surface in the desired manner. For instance, there are known methods for plasma carburizing, plasma nitriding or plasma coating of metals. The workpieces to be treated are placed in an oven while still being cold. The workpieces are cleaned by a treatment performed at low pressure, are heated at increasing pressure, then are subjected to plasma treatment and are finally cooled off.

A plasma treatment apparatus as described in U.S. Pat. No. 4,645,981 comprises a vacuum container wherein the workpiece is to be placed. The workpiece is connected to an electrode, and the inner wall of the vacuum container or the container itself is used as a counterelectrode. In this known apparatus, and also in other vacuum containers for glow-discharge treatment of workpieces, continuous operation is not possible. Instead, the workpieces must be placed in the treatment chamber by batches, then undergo treatment and subsequently be removed again. No possibility exists for treating a plurality of workpieces in such a manner that they are subjected to different lengths or types of treatment. After termination of a treatment, for exchanging the workpiece, the vacuum has to be relieved while also the gas and the heat contained in the vacuum chamber escape. Continuous operation of the vacuum chamber for glow-discharge treatment is impossible because the occuring high temperatures in the range of 500° C. to 2000° C. do not allow the use of conveying means. Due to the high temperatures and the discharge conditions in the vacuum chamber, those components that contact each other tend to undesired welding and erosion. Therefore, in known plasma heat treatment apparatuses, all of the components are stationary during treatment.

A treatment apparatus known from U.S. Pat. No. 4,501,766 has a treatment chamber wherein a rotating means is arranged in the manner of a carousel. Said rotating means, in turn, holds a plurality of rotatable workpiece supports onto which the workpieces are set. Upon rotation of the rotating apparatus, a gear drive serves for rotating the individual tool supports on the rotating means. The treatment apparatus is a film-depositing apparatus working with high-frequency energy wherein the workpieces are heated and connected to an electric potential while a channel provided for conveying the workpieces therethrough is connected to a counterelectrode. High-frequency treatment apparatuses of this type work at a relatively low temperature so that operation of the rotating means and rotation of the workpiece carriers within the chamber are easily performed as far as the rotating means is concerned.

Different from treatments carried out at relatively low operating temperatures, plasma diffusion processes require high temperatures in the range of 500° C. to 2000° C.. Normally, in this case, plasma treatment is performed by pulsed direct current discharge in a vacuum chamber. In contrast to coating processes, plasma diffusion processes, due to the temperature and vacuum conditions, allow no use of parts coming into direct contact with each other. Such componets would undesirably be welded to each other and be destroyed.

It is an object of the invention to provide a plasma treatment apparatus which is adapted for performing different treatments, particularly with different lengths of treatment and different temperatures of the workpieces, in the same treatment chamber, and which is adapted for treatments requiring relatively high temperatures.

SUMMARY OF THE INVENTION

In the plasma treatment apparatus of the invention, the vacuum chamber accommodates a rotating means, subsequently referred to as a rotary plate, which is preferably supported outside the vacuum chamber. All of the components of the rotary plate within the vacuum chamber, i.e. in the zone of high temperatures, can be fixed so that there is no danger of malfunction by wear and tear or welding of material. When the rotary table is supported within the vacuum chamber, the bearing of the rotary table is cooled. In a sort of way, the rotary table is a storage means for holding one or a plurality of workpieces. Adjacent the vacuum chamber, a sluice is arranged for insertion and/or removal of workpieces. Each working-piece placed on the rotary table can be brought into the transfer position at the sluice, and then, with the sluice door opened, the workpiece can be transferred into the sluice. The apparatus of the invention is particularly suited for plasma diffusion treatment of workpieces with pulsed direct-current discharges. These plasma diffusion treatments require high temperatures of more than 500° C. under vacuum conditions. Since the rotating means is arranged outside the vacuum chamber and the vacuum sealing for sealing the shaft passage, or, with the bearing being cooled, is arranged w;.thin the vacuum chamber, the bearing of the rotating device is not exposed to the extreme stresses prevailing in the vacuum chamber.

Preferably, the rotary table is provided as a disc or support grid for placing the workpieces thereon. However, it is also possible to provide the rotary table as a grating, star or spider or a suspension means, i.e as a rack for pending attachment of the workpieces.

Prior to opening the sluice door between the sluice and the vacuum chamber, the same pressure conditions and possibly also the same gas conditions as in the vacuum chamber are established in the sluice. Thus, treatment in the vacuum chamber can be continued also during and after opening the sluice door without extinguishing the glow discharges.

Of course, treatment can be performed not only on individual workpieces but also on batches of workpieces. The workpieces are moved into the vacuum chamber by the rotary plate. Between the sluice and the rotary plate, the workpieces are moved by suitable handling devices preferably arranged on the sluice and subjected to the conditions of the vacuum chamber only for a short time.

Generally, the invention makes it possible to establish substantially equal treatment conditions at all locations in the vacuum chamber. The workpieces can be introduced into the vacuum chamber successively and, after the respective desired length of treatment, be removed from the vacuum chamber again. It is also possible to perform individual workpiece treatments by individually selecting the temperature and/or the length and/or the voltage and/or the form of the voltage of the glow discharge. Thus, different conditions can be established at different working positions within the vacuum chamber. For separating the working positions from each other, the rotary plate is suitably divided into a plurality of compartments by partition walls. Now, each of these compartments can be brought into a desired working position of the vacuum chamber where the workpiece contained in the compartment is individually treated corresponding to the preset conditions.

The treatment apparatus is not restricted to the two-dimensional storage of the pieces on a rotary plate. Moreover, there can be used also a plurality of rotary plates arranged vertically above each rather, for having the workpieces placed thereinto through one or a plurality of sluices. For batching, also axial movement of the rotary plates is possible.

In contrast to previous plasma processes, the whole process is performed at a constant pressure. The different treatment steps, such as cleaning, pre-treatment, curing, coating, aftertreatment, are effected by variation of the other process parameters, such as voltage, form of voltage, temperature and atmosphere.

Since the workpieces can be positioned as desired, energy can be saved by operating the apparatus in a manner allowing partial recovery of the energy stored in the pieces. Thus, upon heating, heat can be taken up at specific locations from heat storages, e.g. walls, where the heat has been stored previously during cooldown of workpieces.

Particularly if a plurality of sluices are connected to the vacuum chamber, at least one of these sluices can be used also as a treatment chamber for performing cleaning, heating and cooling processes therein. These chambers are provided with corresponding handling devices for moving the workpieces.

An embodiment of the invention will be described hereunder in greater detail with reference to the drawings.

DESCRIPTION OF THE PREFERRED EMBODIMENTS

Figure 1:
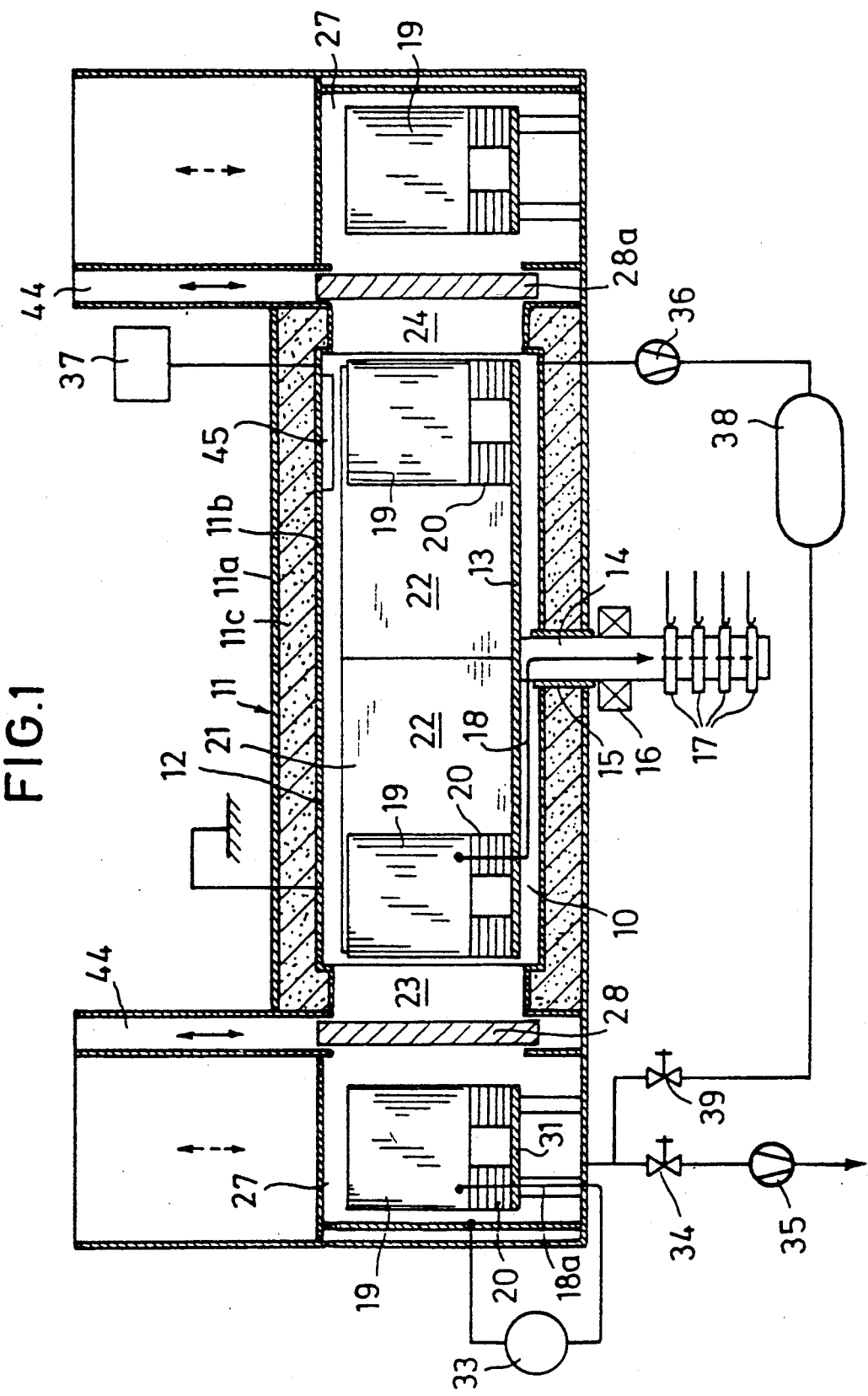
FIG. 1 is a schematic horizontal sectional view of an plasma treatment apparatus.
Figure 2:
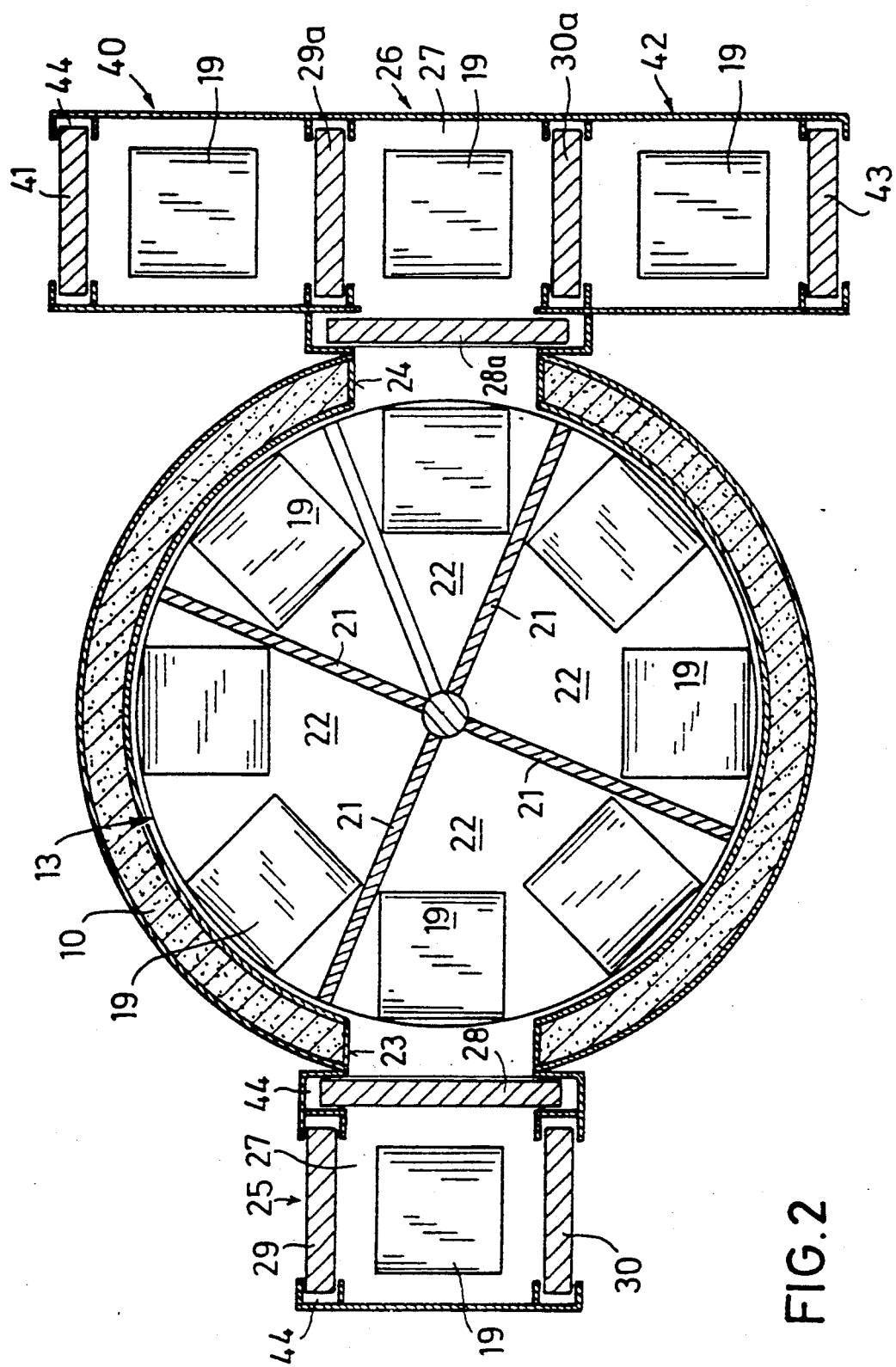
FIG. 2 is a plan view of the apparatus shown in FIG. 1.

The illustrated embodiment of the invention plasma treatment apparatus is provided with a vacuum chamber 10 enclosed by a double-walled casing 11. The double-walled casing 11 consists of an outer wall 11a, an inner wall 11b and an interposed heat-insulating layer 11c. The inner wall 11b also presents the counterelectrode 12 which is connected to ground potential.

The vacuum chamber 10 is formed as a cylinder and houses the rotary plate 13, the axis of rotation thereof extending coaxially to the axis of the vacuum chamber. The rotary plate 13 is fastened to the upper end of the shaft 14 passing through a vacuum sealing 15 in the bottom of the vacuum chamber and being supported outside the vacuum chamber by a bearing 16. Shaft 14 has slip rings 17 arranged thereon which, by individual conduits 18, are connected to the different workpiece places on rotary plate 13 and are adapted to be electrically connected to the workpieces 19. Each of the workpieces 19 stands on electric insulators 20 on rotary plate 13.

The rotary plate is divided into a plurality of sector-shaped compartments 22 by partition walls 21. The partition walls extend to the vicinity of the upper wall of vacuum chamber 22 and in radial direction to the vicinity of the side wall. Each of the compartments 22 of the rotary plate 13 contains at least one workpiece place for receiving a workpiece 19. The workpieces 19 are placed near the edge of the rotary plate.

Under the top wall of vacuum chamber 10, heating means 45 are arranged at the individual working positions whereunder the workpiece places can be stopped. These heating means can consist of heating wires forming part of the counterelectrode 12. Each of said heating means 45 is connected to at least one electric conduit leading to the outside through vacuum chamber 10 and being connectable to a separate heating-current source. Thus, the heating means 45 can be controlled separately from each other so that, when the rotary plate 13 is at a standstill, the temperatures in the individual compartments 22 can be set and controlled separately. Each of the compartments 22 has assigned thereto a temperature sensor, e.g. a thermostat, for controlling the temperature in this compartment. The measuring wire of the temperature sensor is guided through the hollow shaft 14 to the outside.

The insulating layer 11c is arranged within the double-walled casing 11. This insulating layer can have different dampening values at the individual treatment stations so that even with uniform heating of all treatment stations, treatment positions with different temperatures are generated at the treatment stations. Also, heat insulation at the treatment stations can be made settable.

The peripheral wall of the vacuum chamber 10 is provided, at opposite locations, with openings 23,24 for moving the respective workpiece 19 therethrough. Adjacent these openings 23,24, respectively, a sluice 25,26 is arranged, having a vacuum-tight chamber 27. Between chamber 27 and vacuum chamber 10, there is arranged a vertically movable, vacuum-tight door 28. Each of the chambers 27 has about the size of a workpiece place on the rotary plate 13 and serves for receiving a workpiece 19 to be inserted into vacuum chamber 10 or to be removed therefrom.

Further, sluice 25 is provided with two additional vertically movable doors 29 and 30 closing the chamber 27 against its environment. Within chamber 27, a table 31 is arranged at the same height as rotary table 13. Table 13 serves for receiving a workpiece 19 standing on insulators 20. The workpiece can be connected to an electrode 18a connected to an external power source 33. The inner wall of chamber 27 is provided as a counterelectrode and connected to the other pole of power source 33. Thus, pre-treatment of workpiece 19 by glow discharge can be performed within chamber 27 before transferring this workpiece into vacuum chamber 10.

Further, chamber 27 of sluice 25 is connected, through a valve 34, to an external suction pump 35 for evacuation of chamber 27.

Vacuum chamber 10 is connected to an external suction pump 36 for evacuation of the vacuum chamber. Also, vacuum chamber 10 is connected to a gas source 37 for supplying a treatment gas, e.g. hydrogen, nitrogen, methane or argon or a gas mixture into the vacuum chamber. For maintaining the vacuum, this treatment gas is sucked off by suction pump 36. The pressure outlet of vacuum pump 36 leads to a collecting container 38 whose outlet is connected through a valve 39 to chamber 27 of sluice 25. Within said collecting container 38, the sucked treatment gas is collected under pressure. The treatment gas can be inserted, through the throttling valve 39, into sluice 25 so that, for treatment, the same gas is used in the sluice as in vacuum chamber 10. Gas pressure in both chambers 10 and 29 can be controlled in such a manner that its value is in the range between 0 and 10 millibar.

Sluice 27 is further provided with a door 28a connected to opening 24 of the vacuum chamber for vacuum-tight closure and with two vertically movable side doors 29a,30. Door 29a leads to a treatment chamber 40, having a further door 40 leading outside, wherein the workpiece 19 is exposed, e.g. for quenching in an air current. Door 30a leads to a treatment chamber 42 which, through another door 43, is connected to the environment and wherein the workpiece 19 undergoes e.g. water treatment by spraying for the curing of the workpiece.

All of the doors of sluices 25,26 and of treatment chambers 40,42 are received in vertical sliding guides 44 extending beyond the respective sluice or the treatment chamber, respectively, so that the doors can be moved vertically out of the respective door openings.

Operation of the described plasma treatment apparatus is as follows: While door 28 is in its closing position, the workpiece to be treated is inserted into the sluice 25 through the opened door 30 and is connected to the electrode 18a. Then, door 30 is closed. Chamber 27 is evacuated and a treatment gas is inserted into this chamber at a very low pressure. By switch-on of the power source 33, a glow discharge between the workpiece 19 and the counterelectrode 34 is effected. In this manner, the workpiece 19 is subjected to a surface-cleaning pre-treatment under vacuum conditions.

After termination of this pre-treatment, the existing atmosphere is sucked off by pump 35 via valve 34, and through valve 39, gas is inserted from the collecting container 38 in such a quantity that a balance of pressure values is established between sluice 29 and vacuum chamber 10. Then, door 28 is opened, and workpiece 19 is transferred by a manipulator (not shown) from chamber 29 to rotary plate 13 in vacuum chamber 10. Subsequently, door 28 is closed again and the rotary plate, under control of a computer, is rotated such that the workpiece 19 is brought into a predetermined treatment position within vacuum chamber 10 where the workpiece is subjected to the effect of a heating means 45 and a glow discharge takes place at the same time During this process, the workpiece is connected to electrode 18. Afterwards, other treatment processes with other operating parameters can be carried out within the vacuum chamber in other treatment positions. After lapse of the desired treatment length, the workpiece can be removed from the vacuum chamber either through the same sluice 25 through which it had entered the chamber or through the other sluice 26. Out of said other sluice 26, the workpiece can be conveyed into one of the treatment chambers 40 or 42.

In vacuum chamber 10, the same treatment can be performed on the workpieces arranged on different workpiece places of rotary plate 13 and being brought to the different treatment stations of the vacuum chamber according to a predetermined program. By the radiation-shielding partition walls 21, mutual influence of the different treatment conditions is widely excluded.

While the door 28 of sluice 25 is being opened, the treatment within vacuum chamber 10 can be continued without any danger that the glow discharges might cease or change into arc discharges. The reason lies in that the gas, pressure and temperature conditions in sluice 25 can be set to be same as in vacuum chamber 10. Due to the thermic separation of the workpiece places within the vacuum chamber, individual types of treatment can be carried out for the individual workpieces. The apparatus also allows continuous operation with different treatment lengths for the individual workpieces. A process control means controls the treatment and the dwell time of the workpieces in the vacuum chamber and in the individual sluices.

I claim:

1. A plasma diffusion apparatus for the treatment of metallic workpieces by a plasma diffusion process, comprising:
   a sealable vacuum chamber for performing high-temperature plasma treatment processes,
   a plurality of electrodes connectable to the workpieces,
   at least one counterelectrode,
   rotatable support means within the vacuum chamber for supporting the workpieces,
   a sluice adjacent the vacuum chamber, the sluice defining an interior and an exterior,
   a tightly closeable first door between the interior of the sluice and the vacuum chamber, and
   a tightly closeable second door between the interior of the sluice and the exterior of the sluice,
   whereby each of the workpieces is treatable by the plasma diffusion process for a different length of time, and whereby frictional contact within the vacuum chamber during the plasma diffusion process is avoided.

2. The apparatus of claim 1 wherein the vacuum chamber contains a gas, wherein the sluice defines an inlet opening through which gas having a composition substantially identical to the gas in the vacuum chamber may be introduced into the sluice, and further comprising a pump for maintaining a vacuum in the vacuum chamber, the pump defining a pressure side connectable to the inlet opening of the sluice.

3. The apparatus of claim 1 comprising a suction pump connected to the sluice.

4. The apparatus of claim 1 wherein the rotatable support means comprises at least one rotatable support plate for supporting a plurality of workpieces in spaced relationship.

5. The apparatus of claim 4 wherein the rotatable support plate defines a rotational axis and a plurality of workpiece storing positions disposed substantially axially about the rotational axis.

6. The apparatus of claim 4 wherein the sluice, the vacuum chamber and the rotatable support plate are relatively positioned so that access to the rotatable support plate is obtained through the sluice.

7. The apparatus of claim 1 comprising a plurality of partition walls defining a plurality of compartments relative to the rotatable support means.

8. The apparatus of claim 7 wherein the vacuum chamber defines a substantially cylindrical peripheral wall and a ceiling and wherein at least one of the plurality of partition walls extends substantially to the peripheral wall and substantially to the ceiling.

9. The apparatus of claim 7 wherein the vacuum chamber defines a wall and wherein at least one of the plurality of partition walls is in conductive communication with at least one of the vacuum chamber wall and a workpiece.

10. The apparatus of claim 1, comprising:
inner shell means for substantially enclosing the vacuum chamber and absorbing thermal stress, and
outer shell means for substantially enclosing the vacuum chamber and absorbing mechanical stress.

11. The apparatus of claim 1 wherein
the vacuum chamber comprises a double-walled casing including thermal insulation having a plurality of different insulating values at a plurality of different locations along the double-walled casing.

12. The apparatus of claim 1 wherein the vacuum chamber defines a plurality of treatment positions, each of the treatment positions defining a temperature, and further comprising a plurality of independently controllable temperature adjustment means for independently controlling the temperature in each of the plurality of treatment positions.

13. The apparatus of claim 1 wherein the workpieces are arranged relative to the rotatable support means in such a manner that the workpieces are insulated against each other, and wherein each one of the workpieces is connected to a corresponding one of the plurality of electrodes.

14. The apparatus of claim 1 comprising
a shaft on which the support means is supported,
a slip ring provided outside of the vacuum chamber and substantially adjacent the shaft, wherein at least one of the plurality of electrodes is connected to the slip ring.

15. The apparatus of claim 7 comprising individual fluid connections and pumps associated with each of the plurality of compartments.

16. The apparatus of claim 1 comprising an electrode provided in the sluice for connection of a workpiece and a counterelectrode.

17. The apparatus of claim 1 comprising treatment means provided in the sluice for treating the workpieces with at least one of a fluid and a gas.

18. The apparatus of claim 1 comprising at least one additional sluice adjacent the vacuum chamber.

19. The apparatus of claim 1 comprising at least one additional treatment chamber in communication with the sluice.

20. A method for the treatment of metallic workpieces by a plasma diffusion process, comprising:
providing a sealable vacuum chamber for performing hightemperature plasma treatment, the vacuum chamber having an ambient environment,
providing rotatable support means within the vacuum chamber for supporting the workpieces,
providing a sluice adjacent the vacuum chamber, the sluice defining an interior, an exterior, a first closeable aperture between the interior of the sluice and the vacuum chamber, and a second closeable aperture between the interior of the sluice and the exterior of the sluice, the sluice having an ambient environment,
closing the first aperture,
introducing a workpiece into the sluice,
closing the second aperture,
equilizing the ambient environment of the sluice and the ambient environment of the chamber,
opening the first aperture,
transferring the workpiece from the sluice to the rotatable support means within the chamber,
rotating the support means to bring the first workpiece into a predetermined treatment position within the chamber,
treating the workpiece by a plasma diffusion process, and
removing the workpiece from the chamber.

21. The method as in claim 20 wherein the ambient environment of the chamber comprises ambient gas, pressure and temperature conditions, wherein the ambient environment of the sluice comprises ambient gas, pressure and temperature conditions, and wherein the step of equilizing the ambient environment comprises the step of equalizing at least one of the gas, pressure and temperature conditions in the sluice and the gas, pressure and temperature conditions in the chamber.

22. The method as in claim 21 wherein the step of equalizing the ambient environment comprises the step of introducing gas into the sluice.

23. The method as in claim 20 wherein the workpiece comprises a first workpiece, and further comprising the steps of
closing the first aperture prior to the step of treating the first workpiece,
introducing a second workpiece into the sluice
closing the second aperture,
equalizing the ambient environment of the sluice and the ambient environment of the chamber,
opening the first aperture,
transferring the second workpiece from the sluice to the rotatable support plate,
rotating the support plate to bring at least one of the first and second workpieces into a predetermined treatment position within the chamber,
treating at least one of the first and second workpieces by a plasma diffusion process, and
removing at least one of the first and second workpieces from the chamber.

24. The method as in claim 20 wherein the step of removing the workpiece comprises the step of
rotating the support means to position the workpiece substantially adjacent the sluice,
opening the first aperture, and
transferring the workpiece from the rotatable support means to the sluice.

25. The method as in claim 23 further comprising the step of thermically insulating the first and second workpieces from one another.

26. The method of claim 20 comprising the steps of
rotating the rotatable support means into a plurality of different rotational orientations, and
maintaining the support means in each of the plurality of different rotational orientations for a predetermined period of time.

27. A method for the treatment of metallic workpieces by a plasma diffusion process, comprising:
providing a sealable vacuum chamber in which high-temperature plasma treatment is performed on metallic workpieces, the vacuum chamber having an ambient environment,
providing rotatable support means within the vacuum chamber, the rotatable support means supporting a plurality of workpieces,
providing a sluice adjacent the vacuum chamber, the sluice having an ambient environment, identifying one of the plurality of workpieces supported by the rotatable support means for removal from the chamber,
rotating the rotatable support means so that the identified workpiece is substantially adjacent the sluice,
equilizing the ambient environment in the chamber and the ambient environment in the sluice,
transferring the identified workpiece from the chamber to the sluice, whereby the ambient environment in the chamber remains substantially undisturbed, and whereby each of the plurality of workpieces is subjected to an individually determined plasma treatment period.

* * * * *